United States Patent
Cho et al.

(10) Patent No.: US 6,740,531 B2
(45) Date of Patent: May 25, 2004

(54) METHOD OF FABRICATING INTEGRATED CIRCUIT DEVICES HAVING DIELECTRIC REGIONS PROTECTED WITH MULTI-LAYER INSULATION STRUCTURES

(75) Inventors: Hag-ju Cho, Seoul (KR); Hyeong-geun An, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/923,670

(22) Filed: Mar. 7, 2001

(65) Prior Publication Data

US 2002/0021544 A1 Feb. 21, 2002

(30) Foreign Application Priority Data

Aug. 11, 2000 (KR) ......................................... 2000-46615

(51) Int. Cl.[7] .......................... H01L 21/00; H01L 21/20; H01L 21/8242
(52) U.S. Cl. .......................... 438/3; 438/240; 438/250; 438/253; 438/393; 438/396
(58) Field of Search .......................... 438/3, 240, 250, 438/253, 393, 396

(56) References Cited

U.S. PATENT DOCUMENTS

| | | | | |
|---|---|---|---|---|
| 5,216,572 A | * | 6/1993 | Larson et al. | 361/313 |
| 5,728,603 A | * | 3/1998 | Emesh et al. | 438/3 |
| 6,107,136 A | * | 8/2000 | Melnick et al. | 438/253 |
| 6,188,100 B1 | * | 2/2001 | Hermes | 257/309 |
| 6,204,158 B1 | * | 3/2001 | Hendrix et al. | 438/563 |
| 6,284,588 B1 | * | 9/2001 | Yu | 438/240 |
| 6,403,441 B1 | * | 6/2002 | Takehiro et al. | 438/396 |
| 2002/0063274 A1 | * | 5/2002 | Kanaya et al. | 257/310 |

FOREIGN PATENT DOCUMENTS

| | | | | |
|---|---|---|---|---|
| EP | 0 747 938 A2 | * | 12/1996 | H01L/21/3205 |
| JP | 7-030074 A | * | 1/1995 | H01L/27/10 |
| KR | 10-0234361 B1 | | 3/1998 | |
| KR | 10-1998-0036879 B1 | | 4/2000 | |

OTHER PUBLICATIONS

Notice to Submit Response, Korean Application No. 10–2000–0046615.

* cited by examiner

Primary Examiner—Amir Zarabian
Assistant Examiner—Toniae M. Thomas
(74) Attorney, Agent, or Firm—Myers Bigel Sibley & Sajovec

(57) ABSTRACT

A dielectric region, such as a ferroelectric dielectric region of an integrated circuit capacitor, is protected by a multi-layer insulation structure including a first relatively thin insulation layer, e.g., an aluminum oxide or other metal oxide layer, and a second, thicker insulating layer, e.g., a second aluminum oxide or other metal oxide layer. Before formation of the second insulation layer, the first insulation layer and the dielectric preferably annealed, which can increase a remnant polarization of the dielectric region. The first insulation layer can serve as a hydrogen diffusion barrier during formation of the second insulation layer and other overlying structures. In this manner, degradation of the dielectric can be reduced. Devices and fabrication methods are discussed.

19 Claims, 11 Drawing Sheets

METHOD OF FABRICATING INTEGRATED CIRCUIT DEVICES HAVING DIELECTRIC REGIONS PROTECTED WITH MULTI-LAYER INSULATION STRUCTURES

RELATED APPLICATION

This application claims the benefit of Korean Application No. 2000-46615, filed Aug. 11, 2000, the disclosure of which is hereby incorporated herein by reference.

FIELD OF THE INVENTION

The present invention relates to integrated circuit memory devices, and more particularly, to protective structures for dielectric regions, such as capacitor dielectrics, and methods for fabricating the same.

BACKGROUND OF THE INVENTION

As the integration density of integrated circuit memory devices increases, there are typically decreases in, for example, the area of memory cells in the device. Decreasing the area of memory cells in the device may reduce the capacitance of capacitors in such devices. To increase the effective area of a three-dimensional capacitor on a substrate a thin dielectric layer may be interposed between upper and lower electrodes of a capacitor. The dielectric layer preferably comprises a material having high dielectric constant. However, manufacturing processes associated with forming such capacitors may be complex and relatively expensive. In addition, Fowler-Nordheim currents may cause decreased reliability of resultant devices if the thickness of the dielectric layer is smaller than, for example, 100 Å.

These problems have made the use of high dielectric constant ferroelectric substances an attractive choice for the dielectric layer of capacitors in integrated circuit memory devices. Like ferromagnetic substances, ferroelectric substances have a hysteresis characteristic in which a remnant polarization value changes under a given electric field. Thus, ferroelectric substances can have a remnant polarization ($P_r$) even in the absence of an external electric field. One important parameter in determining the operating voltage of a device can be referred to as a coercive electric field. The coercive electric field is present when the external electric field causes the value of the remnant polarization ($P_r$) to be 0. The remnant polarization ($P_r$) makes reading and writing possible in, for example, ferroelectric RAM (FRAM) devices.

However, when the dielectric layer of the capacitor comprises a ferroelectric material, the dielectric characteristic of the dielectric layer can be degraded during manufacturing of integrated circuit memory devices. For example, after the capacitor is be formed, an interlayer dielectric (ILD) process, an intermetal dielectric (IMD) process and a passivation process may be performed. In performing these processes, chemical vapor deposition (CVD) and/or plasma enhanced CVD (PE-CVD) deposition processes can be used in which hydrogen gas and/or silane ($SiH_4$) gases are used as a carrier gas. However, when carrier gases such as these are used, the gas can directly react with oxygen present in the ferroelectric material, such as $Pb(ZrTi)O_3$ and/or $SrBi_2Ta_2O_9$, to yield water ($H_2O$). As a result, the ferroelectric material may lack oxygen which can degrade electrical characteristics of the ferroelectric material.

To solve this problem, a method of encapsulating a capacitor with a single insulation layer has been used. For example, U.S. Pat. No. 5,822,175 discloses a method of encapsulating a capacitor with a silicon oxide layer, a doped silicon nitride layer and a silicon nitride layer to reduce degradation of the dielectric layer. To enhance the insulation properties of the dielectric layer, an annealing process can be performed in an oxygen atmosphere at a temperature of 600–800° C. Unfortunately, hydrogen can be generated when an encapsulating layer is formed. This hydrogen may diffuse into the dielectric layer. Moreover, the diffusion of hydrogen can be accelerated during the succeeding annealing process.

SUMMARY OF THE INVENTION

In some embodiments of the present invention, a memory device includes a capacitor comprising a lower electrode, an upper electrode and a dielectric layer interposed between the lower electrode and the upper electrode. A multi-layered encapsulating layer surrounds the capacitor, the multi-layered encapsulating layer comprising a first blocking layer, e.g., a first metallic oxide layer, which is annealed and a first protection layer, e.g., a second metallic oxide layer, formed on the surface of the annealed first blocking layer, the first blocking layer and the protection layer being formed of the same material. Preferably, the first blocking layer has a thickness sufficient to block diffusion of hydrogen generated during the formation of the first protection layer.

In other embodiments of the present invention, a memory device comprises a lower electrode, a dielectric layer formed on a predetermined portion of the surface of the lower electrode, and a spacer layer formed on the lower electrode, the spacer layer comprising a blocking spacer directly contacting each sidewall of the dielectric layer and a protection spacer formed on the blocking spacer. An interlayer insulation layer is formed on the lower electrode to contact the protection spacer and an upper electrode is formed on the dielectric layer. A multi-layered encapsulating layer surrounds the interlayer insulation layer, the spacer layer and the upper electrode, the multi-layered encapsulating layer comprising a first blocking layer which is annealed and a first protection layer formed on the surface of the annealed first blocking layer, the first blocking layer and the protection layer being formed of the same material, e.g., a metal oxide.

In still other embodiments of the present invention, an integrated circuit comprises a ferroelectric dielectric region on a substrate, a first metal oxide layer directly on a surface of the ferroelectric dielectric region, and a second metal oxide layer on the first metal oxide layer. The first metal oxide layer is configured to enable a remnant polarization of the ferroelectric dielectric region to increase during an annealing of the substrate before formation of the second metal oxide layer. The first metal oxide layer preferably is thick enough to substantially impede diffusion of hydrogen into the ferroelectric dielectric region in, for example, subsequent fabrication operations. The first metal oxide layer may comprise a metal oxide selected from the group consisting of $Al_2O_3$, $TiO_2$, $ZrO_2$, $Ta_2O_5$ and $CeO_2$. Similarly, the second metal oxide layer may comprise a metal oxide selected from the group consisting of $Al_2O_3$, $TiO_2$, $ZrO_2$, $Ta_2O_5$ and $CeO_2$. The first and second metal oxide layers may be formed from the same material. In embodiments of the invention, the second metal oxide layer is thicker than the first metal oxide layer. For example, the first and second metal oxide layers may comprise respective first and second metal oxide layers, with the second metal oxide layer being at least about twice as thick as the first metal oxide layer, and less than about ten times thicker than the first metal oxide layer.

In method embodiments of the present invention, a memory device is fabricated. A capacitor is formed on a semiconductor substrate, the capacitor comprising a lower electrode, an upper electrode and a dielectric layer interposed between the lower electrode and the upper electrode. A multi-layered encapsulating layer is formed to surround the capacitor, the multi-layered encapsulating layer comprising a first blocking layer which is annealed and a first protection layer formed on the surface of the first blocking layer, the first blocking layer and the protection layer being formed of the same material. Preferably, the first blocking layer is formed to have an enough thickness to block diffusion of hydrogen generated during the formation of the first protection layer.

According to other method embodiments of the present invention, a protective structure for a ferroelectric dielectric region on an integrated circuit substrate is formed by depositing a first metal oxide layer directly on a surface of the ferroelectric dielectric region. The first metal oxide layer and the ferroelectric dielectric region are then annealed. A second metal oxide layer is then formed on the first metal oxide layer. Preferably, the first metal oxide layer is sufficiently thin enough to enable a remnant polarization of the ferroelectric dielectric region to increase during the annealing of the first metal oxide layer and the ferroelectric dielectric region, and sufficiently thick enough to reduce diffusion of hydrogen into the dielectric region during the depositing of the second metal oxide layer.

DETAILED DESCRIPTION

Figure 1A:
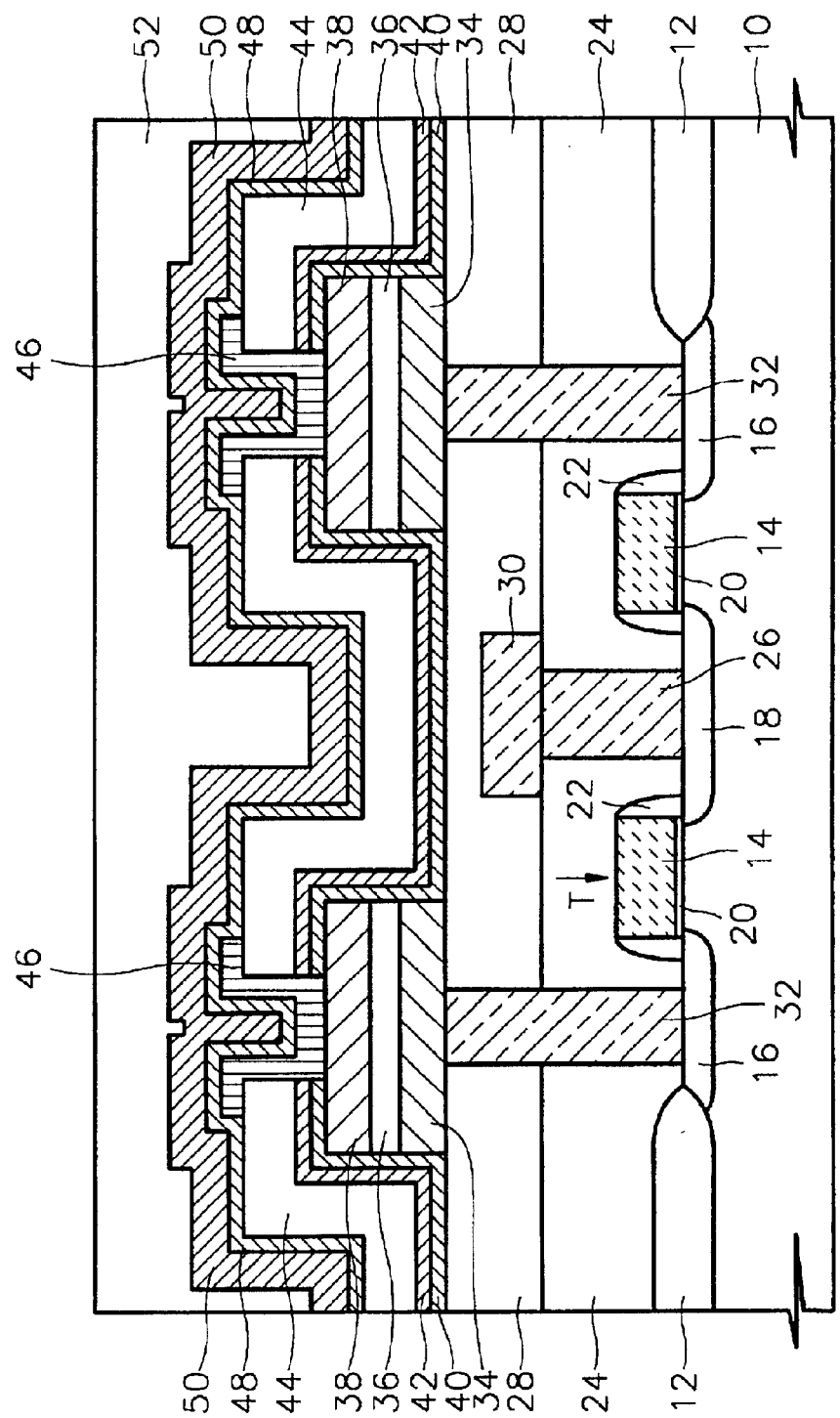
FIG. 1A is a sectional view illustrating an integrated circuit memory device according to embodiments the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Referring to FIG. 1A, a device isolation layer 12 is formed on a semiconductor substrate 10 by a LOCal Oxidation of Silicon (LOCOS) process, and defines an active region. Field effect transistors T are formed in the active region. Alternatively, the device isolation layer 12 may be formed by a trench device isolation method. Each of the field effect transistors T is composed of a gate electrode 14, a source region 16 and a drain region 18. A gate oxide layer 20 is interposed between the gate electrode 14 and the semiconductor substrate 10. Sidewall spacers 22 are formed of a nitride layer on the sidewalls of the gate electrode 14.

A first interlayer insulation layer 24 for electrically isolating adjacent field effect transistors T from each other is formed on the entire surface of the semiconductor substrate 10 including the device isolation layer 12 and the field effect transistors T. The first interlayer insulation layer 24 has a landing plug 26 therein. The second interlayer insulation layer 28 is formed on the first interlayer insulation layer 24 and has a bit line contact pad 30 therein. The bit line contact pad 30 is electrically connected to a bit line not shown and to the landing plug 26 which is connected to an impurity region of a substrate, i.e., the drain region 18. Conductive plugs 32 are formed within the first and second interlayer insulation layers 24 and 28 and connect impurity regions of a substrate, i.e., the source regions 16, to capacitors. In a memory device, a capacitor is composed of a lower electrode 34, a dielectric layer 36 and an upper electrode 38. Each of the lower electrode 34 and the upper electrode 38 may be formed of heat-resist metal, a metal oxide layer or a compound layer of them, for example, Pt, Ir, Ru, Rh, Os or Pd. The dielectric layer 36 may be one selected from the group consisting of $SrTiO_3$, $BaTiO_3$, $(Ba, Sr)TiO_3$, $Pb(Zr, Ti)O_3$, $SrBi_2Ta_2O_9$, $(Pb, La)(Zr, Ti)O_3$ and $Bi_4Ti_3O_{12}$ or a compound layer of some of them. The capacitors are directly connected to the conductive plug 32.

A first encapsulating layer 40 and 42 for protecting the capacitors is formed on the entire surface except a certain portion of the upper electrode 38 of each capacitor and the entire surface of the second interlayer insulation layer 28. A third interlayer insulation layer 44 having opening portions for metal contacts 46 is formed on the surface of the first encapsulating layer 40 and 42. A second encapsulating layer 48 and 50 for protecting the capacitors is formed on the entire surface of the resultant structure having the metal contacts 46. A passivation layer 52 is formed on the entire surface of the resultant structure having the second encapsulating layer 48 and 50.

The first encapsulating layer 40 and 42 and the second encapsulating layer 48 and 50 at least include protection layers 42 and 50, respectively, for protecting the dielectric layers 36 of the capacitors, and blocking layers 40 and 48, respectively, for preventing the diffusion of impurities such as hydrogen generated during the formation of the protection layers 42 and 50. A buffer layer may be interposed of a protection layer and a blocking layer. The first blocking layer 40 of the first encapsulating layer is interposed between the first protection layer 42 of the first encapsulating layer and each of the capacitors. The second blocking layer 48 of the second encapsulating layer is interposed between the second protection layer 50 of the second encapsulating layer and the third interlayer insulation layer 44 formed on the first encapsulating layer. The blocking layer and the protection layer, which may be formed of the same material, are named based on their functions. After being formed, the blocking layer preferably is annealed in a predetermined manner. Annealing for the protection layer may be selectively performed.

Each of the first blocking layer 40, the second blocking layer 48, the first protection layer 42 and the second protection layer 50 are formed of a metal oxide layer and, more preferably, formed of $Al_2O_3$, $TiO_2$, $ZrO_2$ or $CeO_2$. The first and second blocking layers 40 and 48 and the first and second protection layers 42 and 50 may be formed using an atomic layer deposition method, a plasma chemical vapor deposition method or a high or low pressure chemical vapor deposition method.

The first and second blocking layers 40 and 48 may be formed of the same material as the first and second protection layers 42 and 50 and are relatively thinner than the first and second protection layers 42 and 50. To satisfactorily block the diffusion of hydrogen generated when each of the first and second protection layers 42 and 50 is formed, the thickness of each of the first and second blocking layers 40 and 48 and the temperature of a succeeding annealing process preferably is selected taking into account the conditions of processes performed before or after the formation of a capacitor.

In other words, the thicknesses of each of the first and second blocking layers 40 and 48 are preferably such that diffusion of hydrogen generated when the corresponding protection layer 42 or 50 is formed can be blocked. More preferably, the thickness of a blocking layer is 10–50% of the thickness of a corresponding protection layer. To determine the range of the thickness of each of the first and second blocking layers 40 and 48, each of the first and second blocking layers 40 and 48 may be deposited to different thicknesses and annealed under the condition that the composition of a layer used as each of the first and second blocking layers 40 and 48 and the temperature of a succeeding annealing process are fixed. Then, the degree of degradation of a dielectric layer may be investigated. Therefore, the range of a thickness at which the dielectric layer is not degraded may be determined. Meanwhile, under the condition that the composition of each of the first and second blocking layers 40 and 48 and the thickness thereof are fixed, the degree of degradation of a dielectric layer may be investigated while an annealing temperature for each of the first and second blocking layers 40 and 48 is changed. Therefore, the range of a minimum temperature at which a remnant polarization value is sufficiently restored due to an annealing process may be determined. Thus-determined ranges of a thickness and a temperature can be appropriately adjusted taking into account the manufacturing problems related with processes performed before or after the formation of a capacitor and the characteristics of a device.

For example, the first and second blocking layers 40 and 48 and the first and second protection layers 42 and 50 may be formed of $Al_2O_3$. Each of the first and second protection layers 42 and 50 may be formed to a thickness of about 100 Å, each of the first and second blocking layers 40 and 48 may be formed to a thickness of 50 Å or less, preferably, 10–15 Å. For an annealing method, a rapid thermal process (RTP) is used to minimize the diffusion of an impurity, i.e., hydrogen, and annealing is performed at a temperature of 400–600° C., preferably, about 550° C.

The first protection layer 42 of the first encapsulating layer can prevent hydrogen, which is generated while the third interlayer insulation layer 44 is being formed on the surface of the first protection layer 42 and sealed in the third interlayer insulation layer 44, from being diffused into the dielectric layer 36. Degradation of the dielectric characteristic of the dielectric layer 36 due to hydrogen generated during the formation of the first protection layer 42 may be reduced by the first blocking layer 40 interposed between the first protection layer 42 and the dielectric layer 36.

The second protection layer 50 of the second encapsulating layer can prevent hydrogen, which is sealed in the passivation layer 52 formed later, from reaching the dielectric layer 36 via the third interlayer insulation layer 44. Hydrogen is generated when the second protection layer 50, like the first protection layer 42 of the first encapsulating layer, is formed. When only the protection layer 50 is formed between the third interlayer insulation layer 44 and the passivation layer 52 without forming the blocking layer 48 of the second encapsulating layer, hydrogen generated during the formation of the protection layer 50 of the second encapsulating layer may be diffused into the capacitors through the protection layer 50 of the second encapsulating layer, the third interlayer insulating layer 44, the protection layer 48 of the first encapsulating layer and the first blocking layer 42 of the first encapsulating layer. However, in the present invention, the second blocking layer 48 is interposed between the second protection layer 50 and the capacitors, more specifically, the third interlayer insulation layer 44, so that the diffusion of hydrogen sealed in the passivation layer 52 can be more thoroughly blocked.

In this embodiment, the widths of the lower electrode 34, the dielectric layer 36 and the upper electrode 38 are the same, but a lower electrode and a dielectric layer may be formed to have the same width, and an upper electrode may be formed to have a width smaller than those of them, or the width may decrease in order of lower electrode, dielectric layer and upper electrode.

Figure 1B:
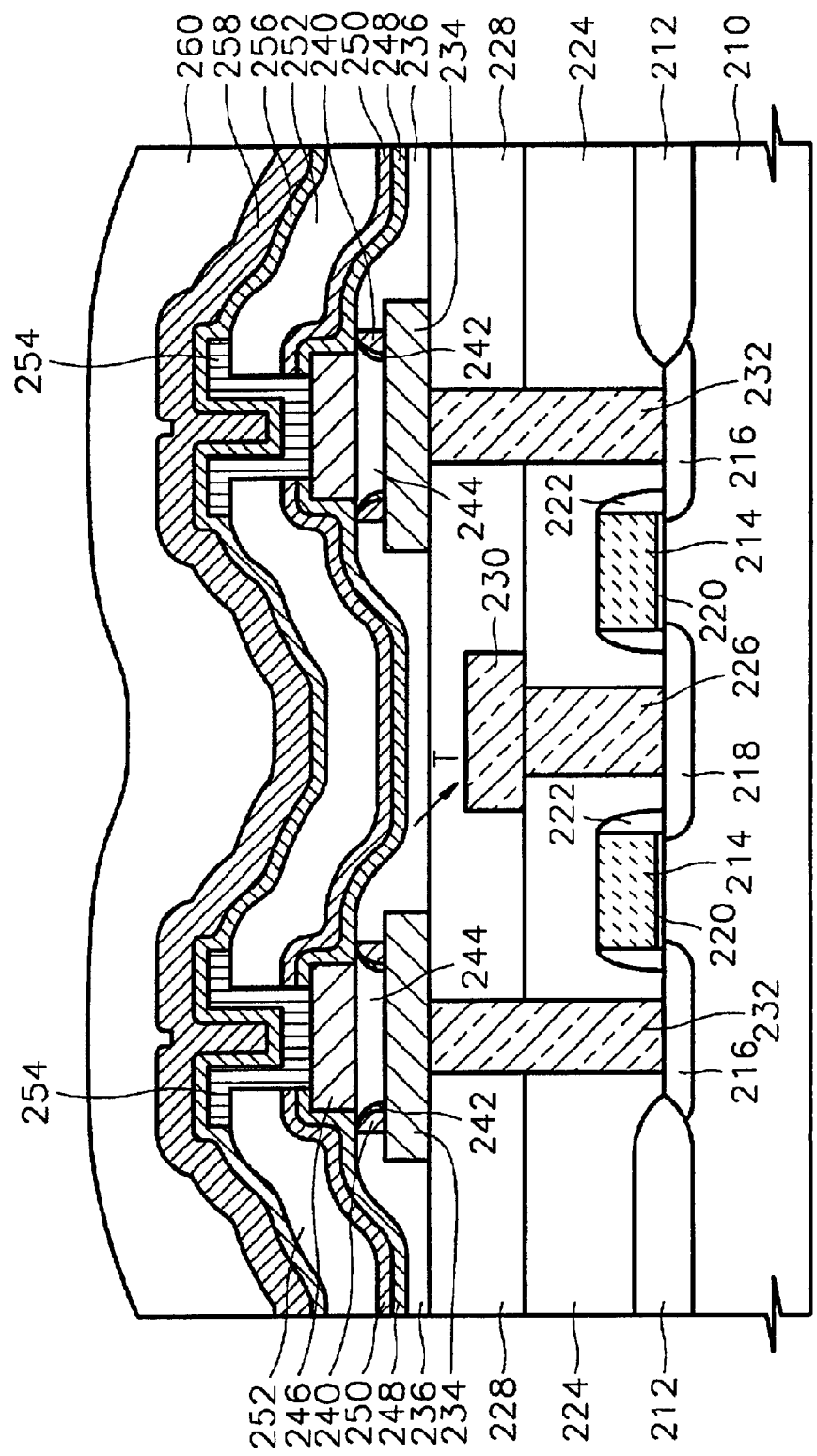
FIG. 1B is a sectional view illustrating an integrated circuit memory device according to embodiments the present invention.

FIG. 1B is a sectional view illustrating the structure of a memory device according to a second embodiment of the present invention. A semiconductor substrate 210, a device isolation layer 212, transistors 214, 216, 218, 220 and 222, a first interlayer insulation layer 224, a landing plug 226, a second interlayer insulation layer 228, a bit line contact pad 230, a contact plug 232 and a lower electrode 234 of a capacitor are substantially the same as the semiconductor substrate 10, the device isolation layer 12, transistors 14, 16, 18, 20 and 22, the first interlayer insulation layer 24, the landing plug 26, the second interlayer insulation layer 28, the bit line contact pad 30, the contact plug 32 and the lower electrode 34 of a capacitor illustrated in FIG. 1A.

A dielectric layer 244 is formed at the center of the top surface of the lower electrode 234 of a capacitor. A third interlayer insulation layer 236 extends from one end of the lower electrode 234 of a capacitor to one end of an adjacent lower electrode. A double spacer is formed between the third interlayer insulation layer 236 and the dielectric layer 244. The double spacer is composed of a blocking spacer 242 directly contacting the dielectric layer 244 and a protection spacer 240 interposed between the blocking spacer 242 and the third interlayer insulation layer 236, and the blocking spacer 242 and the protection spacer 240 are formed of the same material. The blocking spacer 242 can prevent an impurity, such as hydrogen generated during the formation of the protection spacer 240, from diffusing into the dielectric layer 244. The protection spacer 240 can prevent the diffusion of hydrogen sealed in the third interlayer insulation layer 236. A buffer spacer may be further provided between the blocking spacer 242 and the protection spacer 240, but it is preferable to use a double space without a buffer spacer, considering the structure of a spacer.

An upper electrode 246 of a capacitor is formed on the dielectric layer 244. In this embodiment, the widths of the lower electrode 234, the dielectric layer 244 and the upper electrode 246 sequentially decrease, but a lower electrode and an upper electrode may be formed to have the same width, and a dielectric layer may be formed to have a width smaller than those of them.

A metal contact 254 is formed at the center of the surface of the upper electrode 246. A first encapsulating layer 248 and 250 extends from one end of the upper electrode 246 to one end of an adjacent upper electrode. The first encapsulating layer 248 and 250 is composed of a first blocking layer 248 directly contacting and surrounding a capacitor and a first protection layer 250 formed on the blocking layer 248, and the first blocking layer 248 and the first protection layer 250 are formed of the same material. The first encapsulating layer 248 and 250 may be formed of one of the metallic oxides mentioned above, which may be the same as the material the double spacer is formed of. The first encapsulating layer except its portion on which the metal contact 254 is formed is covered with a fourth interlayer insulation layer 252. Like the blocking spacer 242 of the double spacer, the first blocking layer 248 of the first encapsulating layer can prevent an impurity, such as hydrogen generated during the formation of the first protection layer 250, from diffusing into the dielectric layer 244. The first protection layer 250 can prevent the diffusion of hydrogen sealed in the fourth interlayer insulation layer 252.

The metal contact 254 is formed within an opening portion passing through the fourth interlayer insulation layer 252 and the first encapsulating layer to expose the upper electrode 246 and formed on a portion of the surface of the fourth interlayer insulation layer 252. A second encapsulating layer 256 and 258 and a passivation layer 260 are sequentially formed on the resultant structure having the metal contact 254. The second encapsulating layer is composed of a second blocking layer 256 directly contacting the fourth interlayer insulation layer 252 and the metal contact 254 and a second protection layer 258 formed on the second blocking layer 256. The second blocking layer 256 and the second protection layer 258 may be formed of the same material. The second encapsulating layer may be formed of the same material as the double spacer 240 and 242 and/or the first encapsulating layer 248 and 250. Like the first blocking layer 242 of the first encapsulating layer, the second blocking layer 256 of the second encapsulating layer can prevent an impurity such as hydrogen generated during the formation of the second protection layer 258 from diffusing into the dielectric layer 244 through the fourth interlayer insulation layer 252, the second encapsulating layer 256 and 258 and the third interlayer insulation layer 236. The second protection layer 258 can prevent the diffusion of hydrogen sealed in the passivation layer 260.

Each of the double spacer 240 and 242, the first encapsulating layer 248 and 250 and the second encapsulating layer 256 and 258 may be formed of a metal oxide, in particular, formed of $Al_2O_3$, $TiO_2$, $ZrO_2$ or $CeO_2$ and deposited by a method such as an atomic layer deposition method, a plasma chemical vapor deposition method or high or low pressure chemical vapor deposition method and then annealed. The blocking spacer 242 of the double spacer, the blocking layer 248 of the first encapsulating layer and the blocking layer 256 of the second encapsulating layer may be annealed to reverse degradation of the dielectric layer 244 after the deposition. The protection spacer 242 of the double spacer, the protection layer 250 of the first encapsulating layer and the protection layer 258 of the second encapsulating layer may be selectively annealed. A rapid thermal annealing method or an annealing method using a furnace may be used for heating. A buffer layer may be interposed between the first blocking layer 248 and the first protection layer 250 or between the second blocking layer 256 and the second protection layer 258.

Methods for determining the thicknesses of and the annealing temperatures for the protection layer 250 and blocking layer 248 of the first encapsulating layer, the protection layer 258 and blocking layer 256 of the second encapsulating layer, the protection spacer 242 and the blocking spacer 240, are similar to those described in the first embodiment.

Compared to the embodiment of FIG. 1A, this embodiment further forms the protection spacer 240 for reducing the diffusion of hydrogen generated during later processes (processes of forming interlayer insulation layers) and the blocking spacer 242 for reducing the diffusion of hydrogen generated during the formation of the protection spacer 240, on each sidewall of the dielectric layer 244, thereby more effectively reducing the diffusion of hydrogen generated during semiconductor manufacturing processes.

A method of forming the semiconductor device of FIG. 1A will be described with reference to FIGS. 2A through 2C.

Figure 2A:
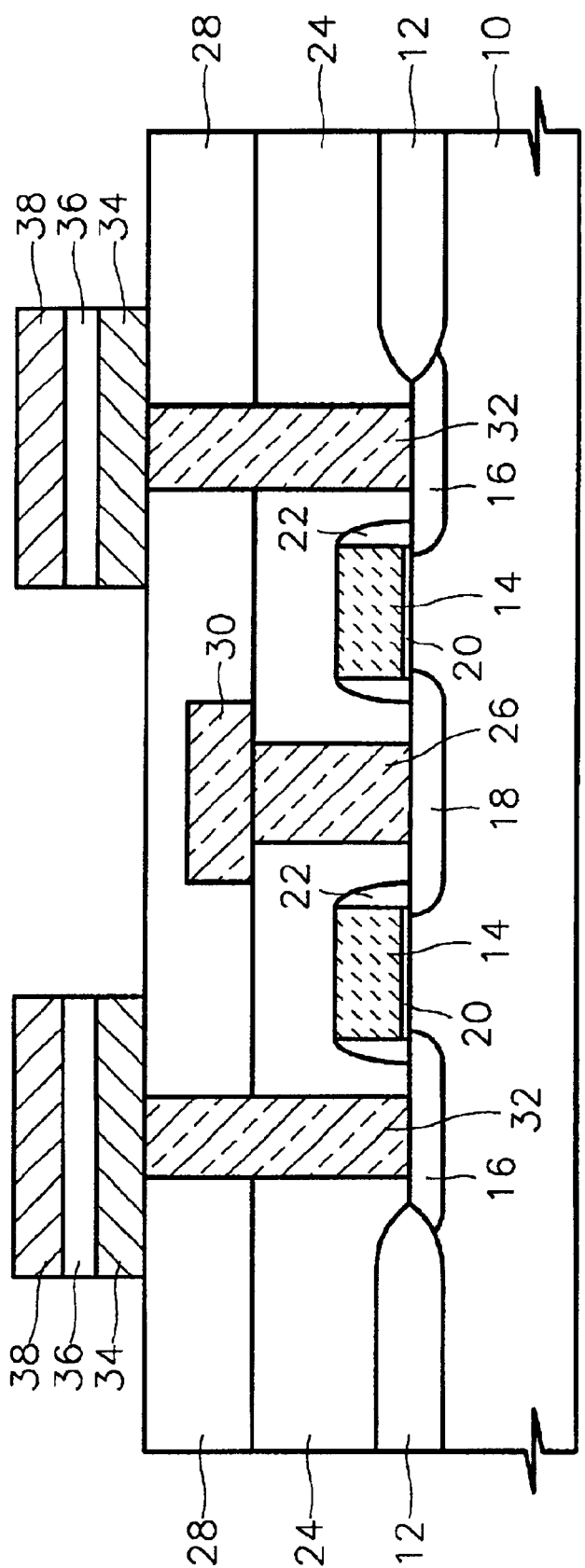
FIGS. 2A through 2C are sectional views illustrating exemplary operations for manufacturing the integrated circuit memory device of FIG. 1A.

Referring to FIG. 2A, an active region is defined by forming a device isolation layer 12 on a semiconductor substrate 10 using a LOCOS method or a trench formation method. Next, a transistor is formed on the active region. The transistor may be a field effect transistor T including a gate electrode 14 having sidewall spacers 22 and a gate insulation layer 20 interposed between the gate electrode 14 and the substrate 10, a source region 16 and a drain region 18.

Next, a first interlayer insulation layer 24 is formed, and a landing plug 26 contacting the drain region 18 of the transistor within the first interlayer insulation layer 24 is formed. Subsequently, a conductive layer is formed on the first interlayer insulation layer 24 and patterned, thereby forming a bit line contact pad 30. A second interlayer insulation layer 28 is formed on the entire surface of the resultant structure having the bit line contact pad 30. A bit line contacting the bit line contact pad 30 is formed on the second interlayer insulation layer 28. Photolithography is performed on the first and second interlayer insulation layers 24 and 28 to form a contact hole exposing the source region 16 of the transistor. The contract hole is filled with a conductive material to form a contact plug 32. It is preferable to use polysilicon as the conductive material. Tungsten, tantalum, ruthenium, iridium, osmium, platinum, tungsten silicide, cobalt silicide, tungsten nitride or a compound of some of them may also be used as the conductive material.

The entire surface of the semiconductor substrate 10 having the contact plug 32 is precleaned. A natural oxide layer is removed from the entire surface of the substrate 10, and the second interlayer insulation layer 28 is planarized.

Thereafter, a conductive layer, for example, a heat-resistant metal layer, a metallic oxide layer or a compound layer thereof, is deposited on the entire surface of the second interlayer insulation layer 28, including the contact plug 32, thereby forming a lower conductive layer. A dielectric layer is formed on the lower conductive layer. The dielectric layer may be formed of $TiO_2$, $Al_2O_3$, $BaTiO_3$, $SrTiO_3$, $Bi_4Ti_3O_{12}$, $PbTiO_3$, $SiO_2$, SiN, (Ba, Sr)$TiO_3$, (Pb, La)(Zr, Ti)$O_3$, Pb(Zr, Ti)$O_3$, $SrBi_2Ta_2O_9$ or a compound thereof, preferably, a ferroelectric compound such as PZT or BST having a high dielectric constant. A conductive layer, for example, a heat-resistant metal layer, a metallic oxide layer or a compound thereof, is deposited on the surface of the dielectric layer, thereby forming an upper conductive layer. The upper conductive layer, the dielectric layer and the lower conductive layer may be patterned by performing one photolithography operation, so that a capacitor composed of an upper electrode 38, a dielectric layer 36 and a lower electrode 34 is formed.

Alternatively, the upper conductive layer may be patterned using a photoresist mask to form the upper electrode 38. Then, the dielectric layer and the lower conductive layer may be patterned using another photoresist mask larger than the upper electrode 38 in width so that a capacitor (now shown) having the dielectric layer 36 and the lower electrode 34 which are the same in width and the upper electrode 38 whose width is smaller than those of the dielectric layer 36 and the lower electrode 34 may be formed.

In other alternative embodiments, the upper conductive layer may be patterned using a first photoresist mask to form the upper electrode 38. Next, the dielectric layer may be patterned using a second photoresist mask which is larger than the upper electrode 38 in width, and the lower conductive layer may be patterned using a third photoresist mask which is larger than the dielectric layer in width, so that a capacitor (not shown) having the upper electrode 38, the dielectric layer 36 and the lower electrode 34 whose widths sequentially increase may be formed.

Figure 2B:
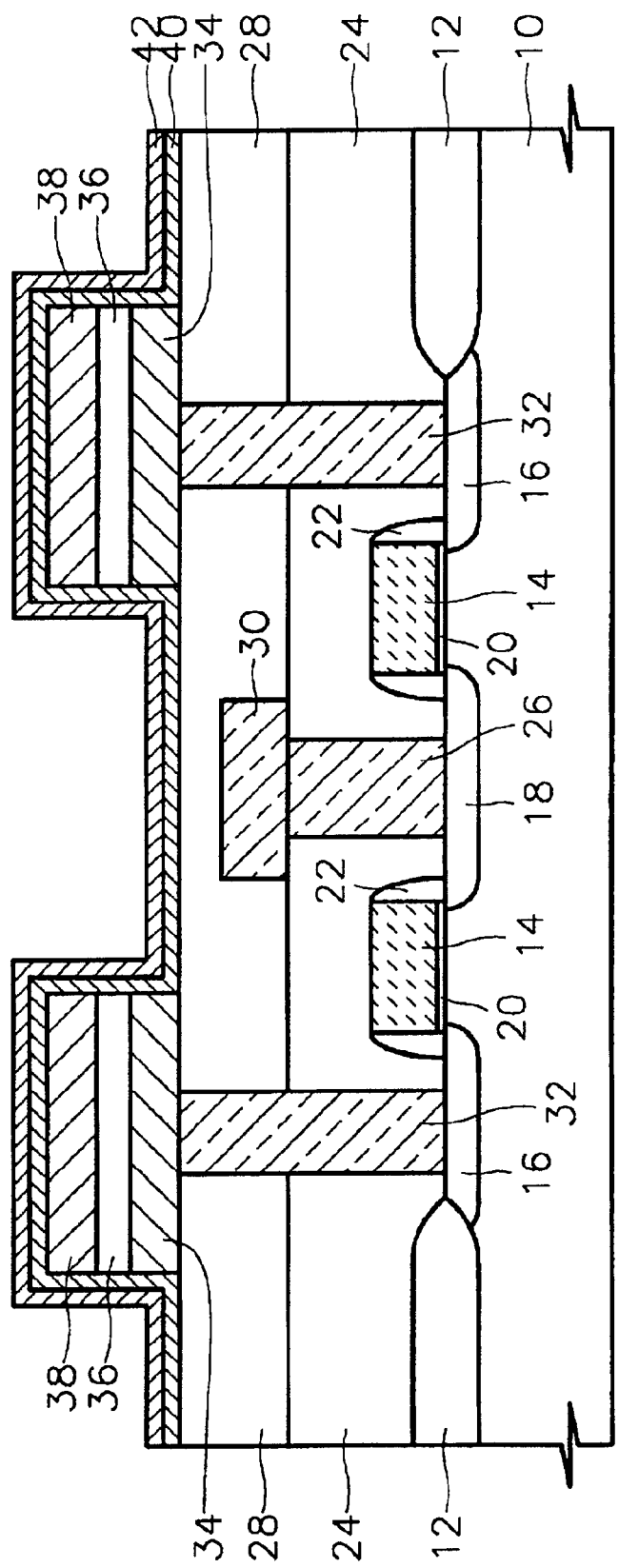

Referring to FIG. 2B, a first encapsulating layer is formed on the entire surface of the resultant structure having capacitors. The first encapsulating layer includes a first protection layer 42 for protecting a capacitor from diffusion of hydrogen which is generated during a later process of forming a third interlayer insulation layer (44 of FIG. 2C) and a first blocking layer 40, interposed between the first protection layer 42 and each of the capacitors, for blocking the diffusion of an impurity such as hydrogen generated during the formation of the first protection layer 42 into the dielectric layer 36 of each capacitor.

The first blocking layer 40 and the first protection layer 42 may be formed of the same material. The first blocking layer 40 and the first protection layer 42 may be formed of metallic oxide, preferably, $Al_2O_3$, $TiO_2$, $ZrO_2$, $Ta_2O_5$, or $CeO_2$. The first blocking layer 40 and the first protection layer 42 may be formed using a method such as an atomic layer deposition method, a low or high pressure chemical vapor deposition method or a plasma chemical vapor deposition method. The first blocking layer 40 may be deposited by one of the methods mentioned above, and then annealed. It is preferable to use a rapid thermal process for the annealing. The first protection layer 42 may be deposited by one of the methods mentioned above, and may be selectively annealed.

The thickness of and the annealing temperature for the first blocking layer 40 preferably are such that the capacitor dielectric layer 36 may not degrade. Under a state in which the material of and the annealing temperature for the first blocking layer 40 is fixed, the degradation characteristic of the dielectric layer 36 may be investigated while the thickness of the first blocking layer 40 may be varied. Therefore, the range of the thickness of the blocking layer 40 at which the dielectric layer 36 may not degrade may be determined. Meanwhile, under a state in which the thickness and material of the first blocking layer 40 are fixed, the annealing temperature for the first blocking layer 40 may be varied. In this manner, the range temperatures at which the value of polarization of the dielectric layer 36 can be restored can be found. The thickness of and the temperature for the first blocking layer 40 can be appropriately adjusted, taking into account the manufacturing problems related with processes performed before or after the formation of a capacitor.

For example, the first blocking layer 40 and the first protection layer 42 may be formed of $Al_2O_3$, e.g., $Al_2O_3$ may be deposited ten times using an atomic layer deposition method such that the first blocking layer 40 is formed to have a thickness of 10–15 Å. Then, the first blocking layer 40 may be annealed for about 1 minute at a temperature of 400–600° C. in an oxygen atmosphere, using a rapid thermal process. $Al_2O_3$ may then be deposited on the annealed first blocking layer 40 one hundred times using an atomic layer deposition method such that the first protection layer 42 is formed to have a thickness of 80–130 Å. The first protection layer 42 may then be selectively annealed for about one minute at a temperature of 400–600° C. in an oxygen atmosphere. The thickness of the first blocking layer 40 is not determined depending on the thickness of the first protection layer 42, but is determined considering the facts that $Al_2O_3$ is used as the material of the first blocking layer 40 and the annealing temperature is 400–600° C. Even if the first blocking layer 40 is a thin film, it can sufficiently serve to block hydrogen generated during the formation of the first protection layer 42 due to the annealing process on the first blocking layer 40.

Figure 2C:
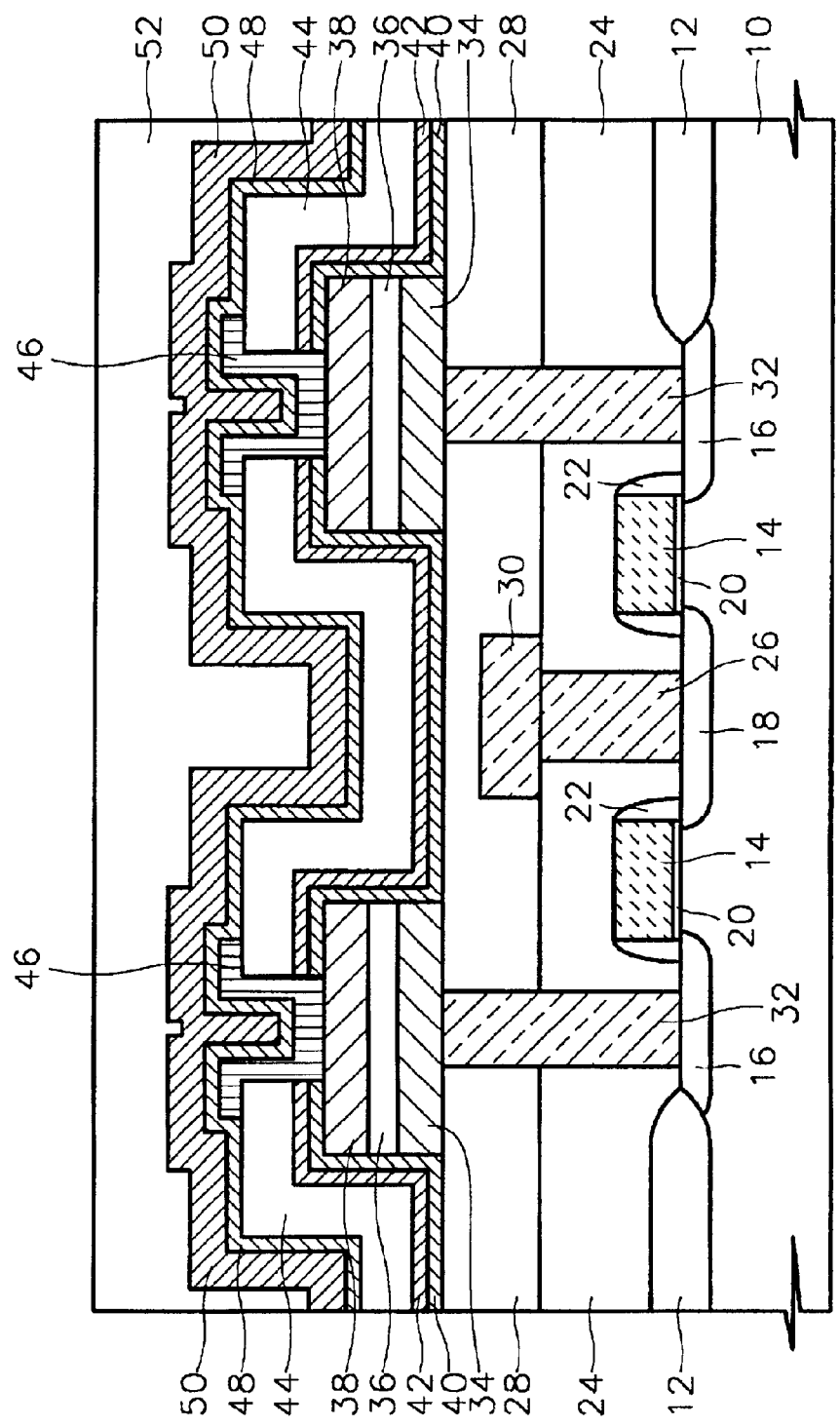

Referring to FIG. 2C, a third interlayer insulation layer 44 is formed on the entire surface of the resultant structure having the first encapsulating layer. Like the first and second interlayer insulation layers 24 and 28, the third interlayer insulation layer 44 may be formed of a silicon oxide layer, a silicon nitride layer, a PhosphoSilicate Glass (PSG) layer, a BoroSilicate Glass (BSG) layer, a BoroPhosphoSilicate Glass (BPSG) layer, a TetraEthylOrthoSilicate Glass (TEOS) layer, an ozone-TEOS layer, a plasma enhanced (PE)-TEOS layer, an undoped silicate glass (USG) layer or a compound layer of any materials. In addition, like the first and second interlayer insulation layers 24 and 28, the third interlayer insulation layer 44 may be formed by a method such as a chemical vapor deposition method, a low or high pressure chemical vapor deposition method or a plasma chemical vapor deposition method.

For example, the third interlayer insulation layer 44 may be formed of silicon oxide using a chemical vapor deposition method, with silane ($SiH_4$) gas and oxygen gas used as reaction gases. Hydrogen is generated as a by-product of the reaction between the silane gas and the oxygen gas. The hydrogen may be sealed in the third interlayer insulation layer 44 and gradually diffuse toward the dielectric layer 36 of a capacitor during later annealing processes. However, according to embodiments of the present invention, such diffusion of hydrogen may be blocked by the first protection layer 42 of the first encapsulating layer. In addition, the first blocking layer 40 formed below the first protection layer 42 may block the diffusion of hydrogen which has been sealed in the third interlayer insulation layer 44, as well as the diffusion of hydrogen generated during the formation of the first protection layer 42.

Since the first blocking layer 40 is formed of the same material as the first protection layer 42, a process of forming the first blocking layer 40 need not be complicated. Moreover, when a first blocking layer of the present invention is very thinly formed of a material having a good selection ratio with respect to an interlayer insulation layer, it is not necessary to perform photolithography for isolating a cell area from a peripheral area after a first encapsulating layer is formed. Accordingly, processes succeeding the formation of the first encapsulating layer can be simplified. An annealing process of compensating for the degradation of a dielectric layer may be performed to block the diffusion of hydrogen generated during the formation of a protection layer. Such an annealing process can be performed at a low temperature within a short time, if the blocking layer is formed of a thin metallic oxide layer. Therefore, the characteristics of a semiconductor device which has been formed before the first encapsulating layer is formed may be less influenced by succeeding processes. For example, the resistance of a buried contact plug contacting a substrate area need not increase.

The third interlayer insulation layer 44, the first protection layer 42 and the first blocking layer 40 may be patterned by a conventional method, thereby forming a contact hole exposing a predetermined portion of the upper electrode 38 of a capacitor. Here, if the first protection layer 42 and the first blocking layer 40 are formed of the same material, a process of forming the contact hole can be simplified. A metal contact 46 may be formed within the contact hole in the third interlayer insulation layer 44 and on a predetermined portion of the surface of the third interlayer insulation layer 44. Thereafter, a recovering annealing process may be performed.

Next, a second encapsulating layer is formed on the entire surface of the semiconductor substrate 10 having the metal contact 46, before a passivation layer 52 is formed. The second encapsulating layer is composed of a second blocking layer 48 and a second protection layer 50. The second protection layer 50 can protect the capacitors from the diffusion of hydrogen generated during the formation of the passivation layer 52. The second blocking layer 48 is interposed between the second protection layer 50 and the third interlayer insulation layer 44 and can block the diffusion of an impurity such as hydrogen generated during the formation of the second protection layer 50 into the dielectric layer 36.

Like the first blocking layer 40 and the first protection layer 42, the second blocking layer 48 and the second protection layer 50 may be formed of the same material. Like the first blocking layer 40 and the first protection layer 42, the second blocking layer 48 and the second protection layer 50 may be formed of metallic oxide, preferably, $Al_2O_3$, $TiO_2$, $ZrO_2$, $Ta_2O_5$, or $CeO_2$. The second blocking layer 48 and the second protection layer 50 may be formed using a method such as an atomic layer deposition method, a low or high pressure chemical vapor deposition method or a plasma chemical vapor deposition method. The second blocking layer 48 may be deposited by one of the methods mentioned above and annealed. It is preferable to use a rapid thermal process for the annealing. The second protection layer 50 may be deposited by one of the methods mentioned above and may be selectively annealed.

The thickness of and the annealing temperature for the second blocking layer 48 may be selected by the same method as used for determining the thickness of and the annealing temperature for the first blocking layer 40.

A passivation process is performed after the second encapsulating layer is formed, thereby forming the passivation layer 52. The passivation layer 52 may be formed of a silicon nitride layer, a silicon oxide layer, a silicon oxynitride layer or a compound layer of any of these materials. The passivation layer 52 may be formed by a chemical vapor deposition method, a physical deposition method, an atomic layer deposition layer, a sputtering method or a laser ablation method. It is preferable to use a chemical vapor deposition method.

When the passivation layer 52 is formed of a silicon nitride layer using a plasma chemical vapor deposition method, hydrogen may be generated as a by-product of the reaction between silane ($SiH_4$) gas and ammonia ($NH_3$) gas used as reaction gases. The hydrogen may be sealed in the passivation layer 52 and may gradually diffuse toward the dielectric layer 36 during later annealing processes. However, in embodiments of the present invention, such diffusion of hydrogen can be blocked by the second protection layer 50 of the second encapsulating layer. In addition, the second blocking layer 48 formed below the second protection layer 50 can block the diffusion of hydrogen which has been sealed in the passivation layer 52 as well as the diffusion of hydrogen generated during the formation of the second protection layer 50.

Like the first blocking layer 40 of the first encapsulating layer, if the second blocking layer 48 is formed of the same material as the second protection layer 50, a process of forming the second blocking layer 48 need not be complicated. Accordingly, the diffusion of hydrogen sealed in the passivation layer 52 can be effectively blocked by a second blocking layer 48 formed by a simple process.

The method of manufacturing an integrated circuit device illustrated FIG. 1B will be described with reference to FIGS. 3A through 3C.

Figure 3A:
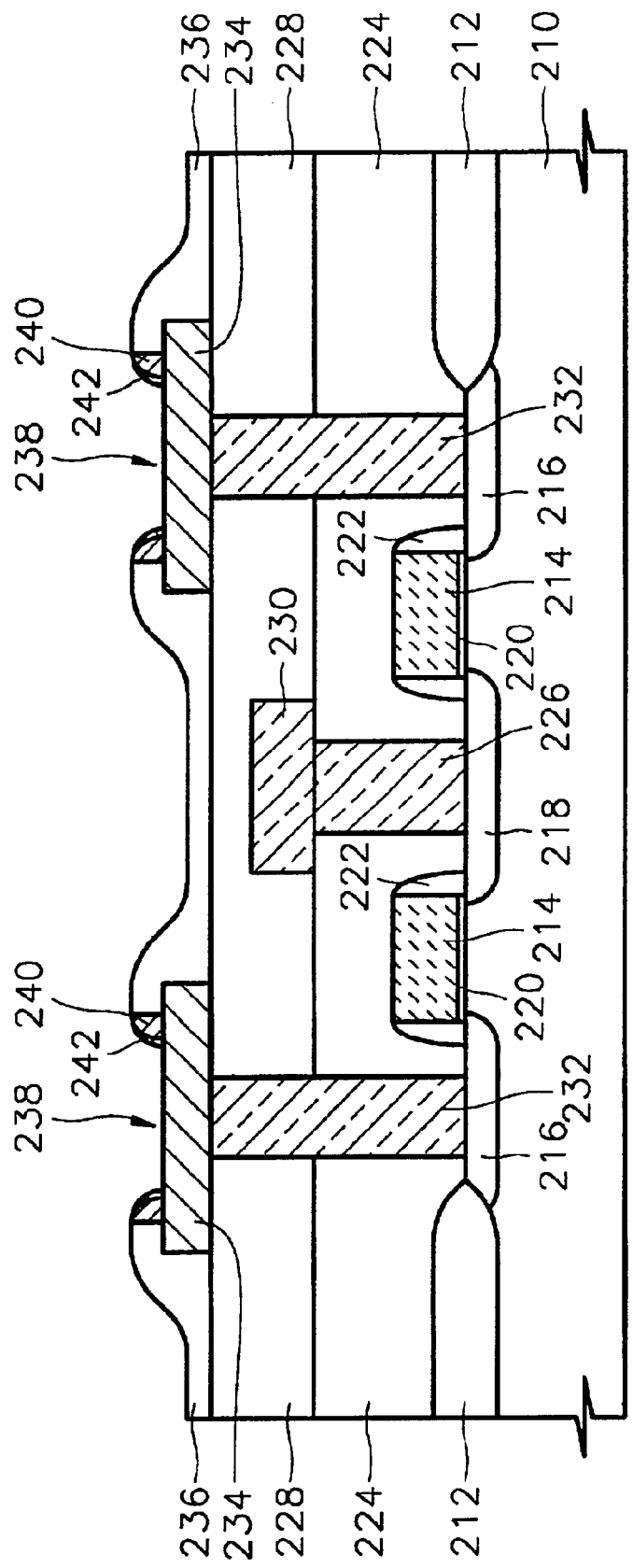
FIGS. 3A through 3C are sectional views illustrating exemplary operations for manufacturing the integrated circuit memory device of FIG. 1B.

Referring to FIG. 3A, methods of forming a semiconductor substrate 210, a device isolation layer 212, transistors 214, 216, 218, 220 and 222, a first interlayer insulation layer 224, a landing plug 226, a second interlayer insulation layer 228, a bit line contact pad 230 and a contact plug 232 may be the same as those of forming the semiconductor substrate 10, the device isolation layer 12, the transistors 14, 16, 18, 20 and 22, the first interlayer insulation layer 24, the landing plug 26, the second interlayer insulation layer 28, the bit line contact pad 30 and the contact plug 32 illustrated in FIG. 2A and, thus, descriptions thereof will be omitted.

The entire surface of the semiconductor substrate 210 having the contact plug 232 is precleaned. Subsequently, a natural oxide layer is removed from the entire surface of the substrate 210, and the second interlayer insulation layer 228 is planarized.

Thereafter, a conductive layer, for example, a heat-resistant metal layer, a metallic oxide layer or a compound layer of them, is deposited on the entire surface of the second interlayer insulation layer 228 including the contact plug 232, thereby forming a lower conductive layer. The lower conductive layer is patterned to form a lower electrode 234. A method such as a chemical vapor deposition method or a physical vapor deposition method may be performed on the entire surface of the second interlayer insulation layer 228 including the lower electrode 234, thereby forming a third interlayer insulation layer 236. The third interlayer insulation layer 236 may be formed of substantially the same material as the third interlayer insulation layer 44 of FIG. 2C. Next, an opening portion 238 exposing the lower electrode 234 of a capacitor is formed within the third interlayer insulation layer 236. In FIG. 3A, the width of the opening portion 238 is smaller than that of the lower electrode 234, but the opening portion 238 may be formed to have the same width as that of the lower electrode 234.

Next, a protection spacer 240 and a blocking spacer 242 are sequentially formed using, for example, an atomic layer deposition method or a chemical vapor deposition method. The protection spacer 240 and the blocking spacer 242 may be formed of the same material. The protection spacer 240 can prevent hydrogen sealed in the third interlayer insulation 236 from diffusing into a dielectric layer (244 of FIG. 3B) formed later. The blocking spacer 242 is formed between the protection spacer 240 and the dielectric layer (which will be formed later) and can block diffusion of hydrogen generated during the formation of the protection spacer 240 into the dielectric layer.

The protection spacer 240 and the blocking spacer 242 may be formed of the same material as the first protection layer 42 and first blocking layer 40 of the first encapsulating layer and the second protection layer 50 and second blocking layer 48 of the second encapsulating layer illustrated in FIGS. 2A through 2C. For example, they may be formed from a metallic oxide, preferably $Al_2O_3$, $TiO_2$, $ZrO_2$, $Ta_2O_5$, or $CeO_2$.

The protection spacer 240 is annealed at 400–600° C. in an oxygen atmosphere to stabilize the quality of the protection spacer 240. The blocking spacer 242 is annealed at 400–600° C. in an oxygen atmosphere to stabilize the quality of the blocking spacer 242. The annealing for the protection spacer 240 may be selectively performed, but the annealing for the blocking spacer 242 should be performed. Otherwise, hydrogen generated during the formation of the protection spacer 240 may diffuse into a dielectric layer which will be formed later, which may degrade the characteristics of the dielectric layer.

To block the diffusion of hydrogen generated during the formation of the protection spacer 240 while the blocking spacer 242 and the protection spacer 240 are formed of the same material, it is preferable to control the thickness of the blocking spacer 242 and the condition of annealing performed after the formation of the blocking spacer 242. The methods of determining the thickness of and the annealing temperature for the blocking spacer 242 may be the same as those used for determining the thicknesses of and the annealing temperatures for the first and second blocking layers 40 and 48 according to the earlier-described embodiment.

Figure 3B:
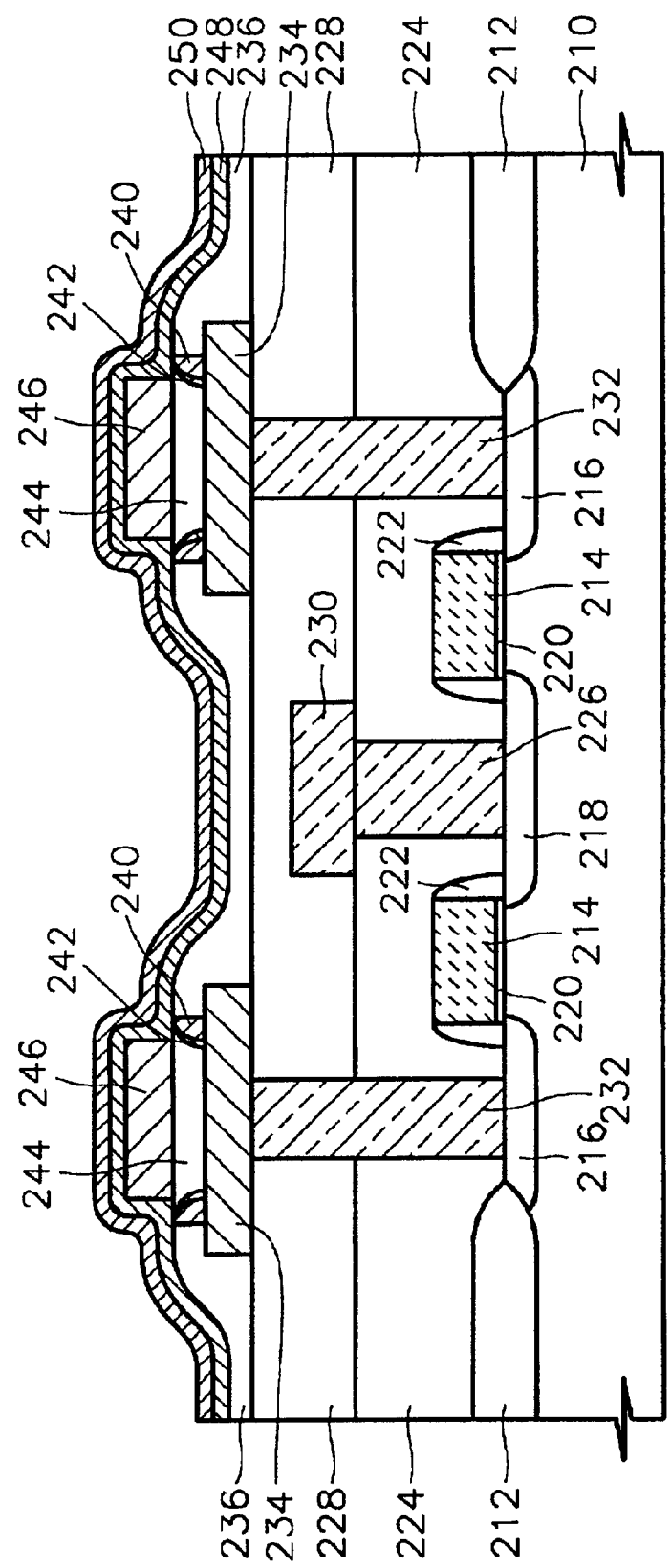

In FIG. 3B, a dielectric layer 244 of a capacitor is formed in the opening portion 238 using a conventional method such as a sol-gel method. A conductive material is deposited on the surface of the dielectric layer 244 and patterned, thereby forming an upper electrode 246. In FIG. 3B, the width of the upper electrode 246 is smaller than the width of the dielectric layer 244 including the protection spacer 240 and the blocking spacer 242. However, the upper electrode 246 may be formed to have the same width as that of the dielectric layer 244.

After completing a capacitor composed of the lower electrode 234, the dielectric layer 244 and the upper electrode 246, a first encapsulating layer surrounding the capacitor is formed on the entire surface of the resultant structure. The first encapsulating layer includes a first blocking layer 248 formed on the upper electrode 246 and the third interlayer insulation layer 236, and a first protection layer 250 formed on the first blocking layer 248. The first blocking layer 248 and the first protection layer 250 may be formed of the same material. The first blocking layer 248 preferably is annealed after deposition so that it can block diffusion of hydrogen generated during the formation of the first protection layer 250 into the dielectric layer 244. The first protection layer 250 can protect the dielectric layer 244 from the diffusion of hydrogen sealed in an interlayer insulation layer (252 of FIG. 3C) formed later.

The first blocking layer 248 and the first protection layer 250 may be formed of the same metallic oxide as the protection spacer 240 and the blocking spacer 242, preferably, of $Al_2O_3$, $TiO_2$, $ZrO_2$, $Ta_2O_5$, or $CeO_2$. The first blocking layer 248 and the first protection layer 250 may be formed by a method such as a high pressure chemical vapor deposition method, a low pressure chemical vapor deposition method, a plasma chemical vapor deposition method or an atomic layer deposition method.

The thickness and the annealing conditions of the first blocking layer 248, which allow the first blocking layer 248 to perform its function, may be determined in the same manner as used for determining the thicknesses and the annealing conditions of the blocking spacer 242 of this embodiment and the first and second blocking layers 40 and 48 of the second embodiment.

Thereafter, the first protection layer 250 may be annealed at 400–600° C. in an oxygen atmosphere to stabilize the quality thereof. For the annealing, a rapid thermal process or a method using a furnace may be used.

Figure 3C:
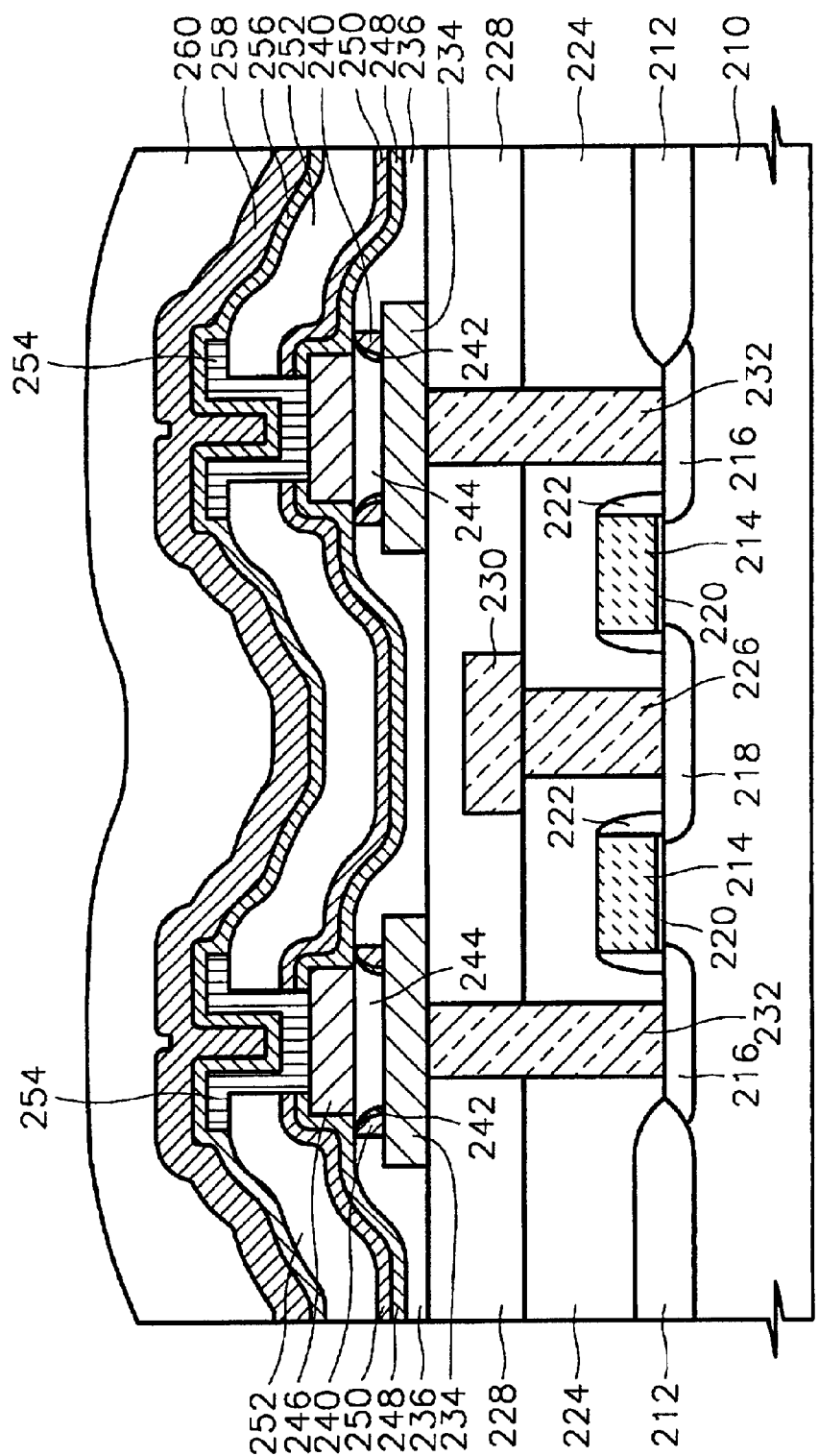

Referring to FIG. 3C, a fourth interlayer insulation layer 252 is formed on the entire surface of the resultant structure having the first encapsulating layer 248 and 250. Like the first through third interlayer insulation layers 224, 228 and 236, the fourth interlayer insulation layer 252 may be a silicon oxide layer, a silicon nitride layer, a BSG layer, a BPSG layer, a TEOS layer, an ozone-TEOS layer, a PE-TEOS layer, an USG layer or a compound layer of some of them. In addition, like the first through third interlayer insulation layers 224, 228 and 236, the fourth interlayer insulation layer 252 may be formed by a method such as a chemical vapor deposition method, a low pressure chemical vapor deposition method or a plasma enhanced chemical vapor deposition method. Accordingly, as described in FIG. 2C, hydrogen may be generated during the formation of the fourth interlayer insulation layer 252 and sealed in the fourth interlayer insulation layer 252. As described above, this hydrogen may gradually diffuse toward the dielectric layer 244 during succeeding annealing processes. Because there are the first encapsulating layer composed of the first protection layer 250 and the first blocking layer 248, the third interlayer insulation layer 236, the protection spacer 240 and the blocking spacer 242 in the diffusion path of the hydrogen which is sealed in the fourth interlayer insulation layer 252, the amount of hydrogen reaching the dielectric layer 244 may be sufficiently reduced to prevent significant degradation of the characteristics of the device. However, it may happen that the amount of diffusing hydrogen is not insignificant under some manufacturing conditions. Even in this case, the diffusion of hydrogen can be blocked by the first protection layer 250 and the first blocking layer 248.

If the first blocking layer 248 may be formed of the same material as the first protection layer 250, and the thickness of the first blocking layer 248 may be thinner than that of the first protection layer 250, a process of forming the first blocking layer 248 need not be complicated. Moreover, if the first blocking layer 248 is very thinly formed of a material having a good selection ratio with respect to the fourth interlayer insulation layer 252, it may not be necessary to perform photolithography for isolating a cell area from a peripheral area after the first encapsulating layer is formed. Accordingly, processes succeeding the formation of the first encapsulating layer can be simplified. In addition, the characteristics of a semiconductor device which has been formed before the first encapsulating layer is formed may be less influenced by succeeding processes.

The fourth interlayer insulation layer 252, the first protection layer 250 and the first blocking layer 248 may be patterned by a conventional method, thereby forming a metal contact hole exposing a predetermined portion of the upper electrode 246. Since the first protection layer 250 and the first blocking layer 248 may be formed of the same material, a process of forming the metal contact hole can be simplified. A metal contact 254 is formed within the contact hole in the fourth interlayer insulation layer 252 and on a predetermined portion of the surface of the fourth interlayer insulation layer 252. Thereafter, a recovering annealing process may be performed.

Next, a second encapsulating layer is formed on the entire surface of the semiconductor substrate 210 having the metal contact 254, before a passivation layer 260 is formed. The second encapsulating layer is composed of a second blocking layer 256 and a second protection layer 258. The thicknesses, material, forming conditions and function of the second blocking layer 256 and the second protection layer 258 may be the same as those of the second blocking layer 48 and the second protection layer 50 of the second encapsulating layer according to the first embodiment.

After the second encapsulating layer is formed, the passivation layer 260 may be formed by the same method as used for forming the passivation layer 52 in the first embodiment. As described for the first embodiment, hydrogen may be generated as a by-product during the formation of the passivation layer 260. The hydrogen may be sealed in the passivation layer 260 and may gradually diffuse toward the dielectric layer 244 of a capacitor during later annealing processes. However, such diffusion of hydrogen may be blocked by the second protection layer 258 of the second encapsulating layer. In addition, the second blocking layer 256 formed below the second protection layer 258 may block the diffusion of hydrogen which has been sealed in the passivation layer 260, as well as the diffusion of hydrogen generated during the formation of the second protection layer 258.

Like the first blocking layer 248 of the first encapsulating layer, because the second blocking layer 256 may be formed of the same material as the second protection layer 258, and the thickness of the second blocking layer 256 may be thinner than that of the second protection layer 258, a process of forming the second blocking layer 256 need not be complicated. Accordingly, the diffusion of hydrogen sealed in the passivation layer 260 can be effectively blocked by a second blocking layer 256 formed by a simple process.

Figure 4A:
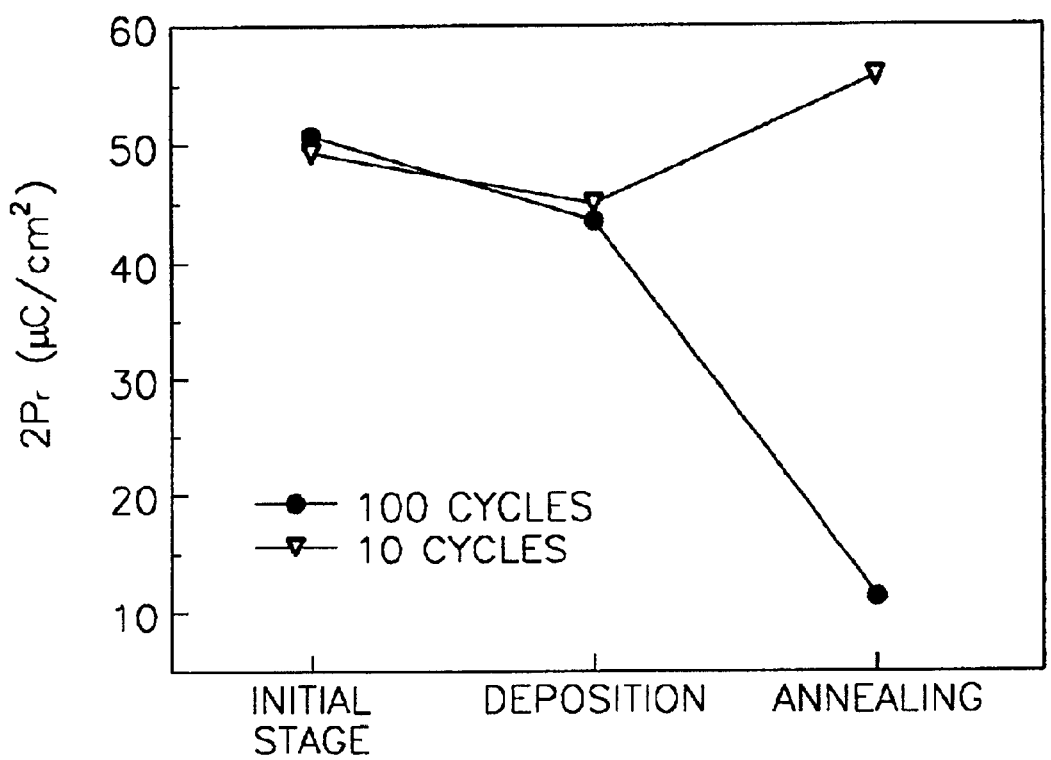
FIG. 4A is a graph illustrating remnant polarization characteristic of ferroelectric dielectric regions having respective different thicknesses of aluminum oxide formed thereon.

To further clarify the idea of the present invention, changes in remnant polarization values will be observed during semiconductor manufacturing processes under a state in which an aluminum oxide layer has different thicknesses, with reference to FIG. 4A.

An aluminum oxide ($Al_2O_3$) layer is formed on the surface of a capacitor composed of $Ir/IrO_2/PZT$ (2000 Å)/Pt by an atomic layer deposition method at a substrate temperature of 300° C. and at a pressure of 0.5 Torr. The graph of FIG. 4A illustrates the remnant polarization values of a capacitor dielectric layer when the aluminum oxide layer is used. In FIG. 4A, a triangular symbol denotes the case of an aluminum oxide layer (hereinafter, referred to as a "thin aluminum oxide layer) having a thickness of 10 Å, and a circular symbol denotes the case of an aluminum oxide layer (hereinafter, referred to as a "thick aluminum oxide layer) having a thickness of 100 Å. The vertical axis denotes remnant polarization values, and the horizontal axis denotes the manufacturing steps. An "initial stage" denotes a state in which a capacitor composed of a lower electrode, a dielectric layer and an upper electrode is completed. "Deposition" denotes a state in which aluminum oxide layers are formed to a thickness of about 10 Å (e.g., 10 cycles of an atomic layer deposition process) and to a thickness of about 100 Å (e.g., 100 cycles of an atomic layer deposition process), respectively. "Annealing" denotes a state in which an aluminum oxide layer is annealed using rapid thermal equipment at about 550° C. in an oxygen atmosphere.

In the "initial stage" in which the thick and thin aluminum oxide layers start to be deposited, for the thick and thin aluminum oxide layers, the remnant polarization values of dielectric layers are not very different. As a deposition process progresses, the remnant polarization values of the capacitor dielectric layers surrounded by the thick and thin aluminum oxide layers decrease. In other words, the dielectric layers are degraded due to the deposition of the aluminum oxide layers. The decrease in the remnant polarization value of the capacitor dielectric layer having the thick aluminum oxide layer thereon is larger than that having the thin aluminum oxide layer thereon. When the two aluminum oxide layers are annealed under the same conditions, as shown in the "annealing" in the graph, the remnant polarization value of the dielectric layer having the thin aluminum oxide layer thereon increases and approaches and, ultimately, exceeds value at the "initial stage". It is believed that this is because the PZT layer used as the capacitor dielectric layer is re-crystallized by the annealing process. In contrast, the remnant polarization value of the dielectric layer having the thick aluminum oxide layer thereon continuously decreases. Although not shown, the remnant polarization of a dielectric layer was degraded when an aluminum oxide layer is formed to a thickness of 50 Å.

It can be seen from the graph of FIG. 4A that damage to a dielectric layer at the initial deposition stage of an aluminum oxide layer can be restored by a succeeding annealing process when a thin aluminum oxide layer is used as an encapsulating layer. Based on this, the inventors infer that the degradation of a dielectric layer can be prevented when a thin aluminum layer is formed under a thick aluminum layer.

The hysteresis characteristics of a dielectric layer in a memory device now will be described with reference to FIGS. 4B and 4C. The horizontal axis denotes external voltages, and the vertical axis denotes remnant polarization values.

An encapsulating layer composed of a titanium oxide layer and an aluminum oxide layer is formed to protect a capacitor made of $Ir/IrO_2/PZT/Pt$. Thereafter, an interlayer insulation layer and aluminum wiring are formed. In this case, the hysteresis of the dielectric layer of the capacitor is as shown as FIG. 4B. The titanium oxide layer is deposited to a thickness of 1000 Å with 1 KW direct current power supply at a substrate temperature of about 500° C. and at a pressure of 8 Torr. The aluminum oxide layer is deposited to a thickness of 100 Å by an atomic layer deposition method at about 500° C. in an oxygen atmosphere.

Figure 4B:
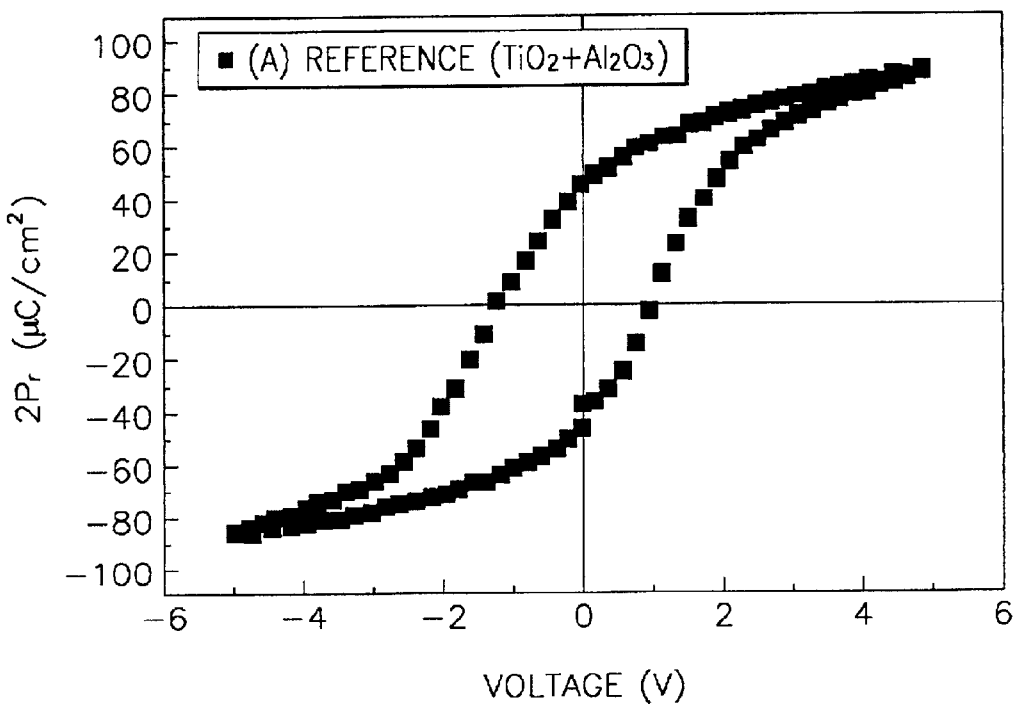
FIG. 4B is a graph illustrating a hysteresis characteristic of a ferroelectric dielectric region having a titanium oxide layer and an aluminum oxide layer formed thereon according to embodiments of the present invention.
Figure 4C:
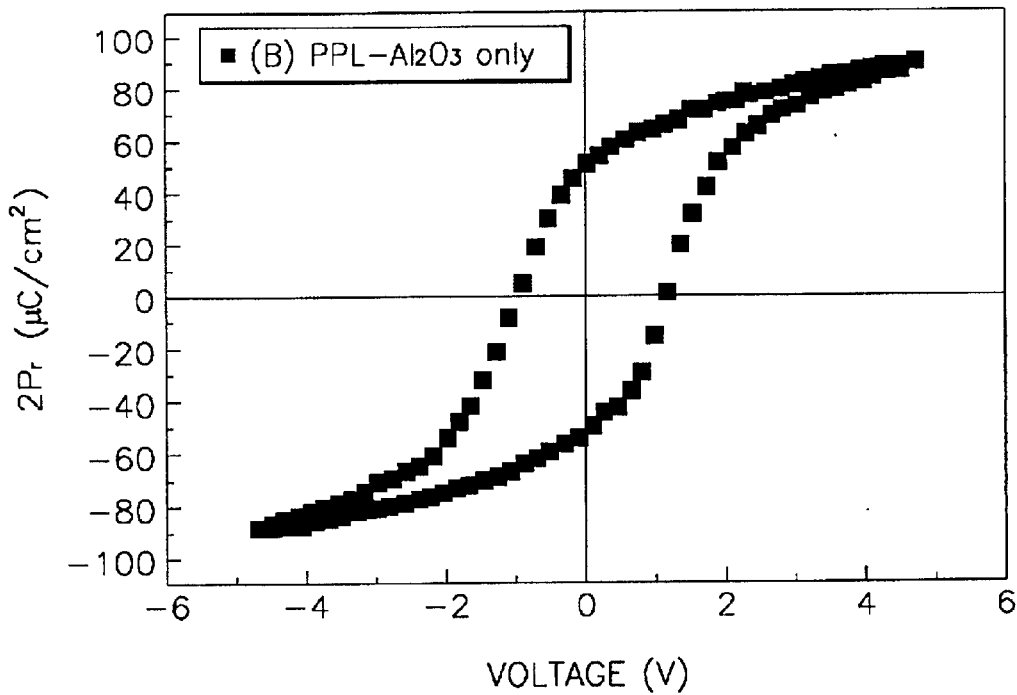
FIG. 4C is a graph illustrating a hysteresis characteristic of a ferroelectric dielectric region having two aluminum oxide layers formed thereon according to embodiments the present invention.

FIG. 4C is a graph illustrating the hysteresis of a dielectric layer of a memory device employing an encapsulating layer including two aluminum oxide layers according to embodiments of the present invention. The thickness of a first aluminum oxide layer (a thin oxide layer) directly contacting a capacitor of Ir/IrO$_2$/PZT/Pt is 10 Å. The thin oxide layer is deposited at about 500° C. in an oxygen atmosphere and rapidly annealed. A second aluminum oxide layer (a thick oxide layer) is formed between the first thin oxide layer and an interlayer insulation layer to a thickness of 100 Å. The thick oxide layer is deposited at about 500° C. in an oxygen atmosphere and rapidly annealed.

The remnant polarization (2P$_r$) of FIG. 4B is 67.9 FC/cm$^2$ while the remnant polarization of FIG. 4C is 84.6 FC/cm$^2$, i.e., the remnant polarization using a double aluminum oxide layer is much larger when combination of a titanium oxide layer and an aluminum oxide layer is used. Therefore, it can be seen that the effect of preventing the degradation of a dielectric layer may be remarkably higher when an encapsulating layer is composed of a double aluminum oxide layer according to the present invention than when an encapsulating layer is composed of a titanium oxide layer and an aluminum oxide layer.

The leakage current of a capacitor when the encapsulating layer of FIG. 4B was used was measured, and the leakage currents of a capacitor when the encapsulating layer of FIG. 4C was used was measured. When the encapsulating layer of FIG. 4B was used, the leakage current was 9×10$^{-10}$ Å/cm$^2$ while the leakage current was 10×10$^{-11}$ Å/cm$^2$ when the encapsulating layer of FIG. 4C was used.

Figure 4D:
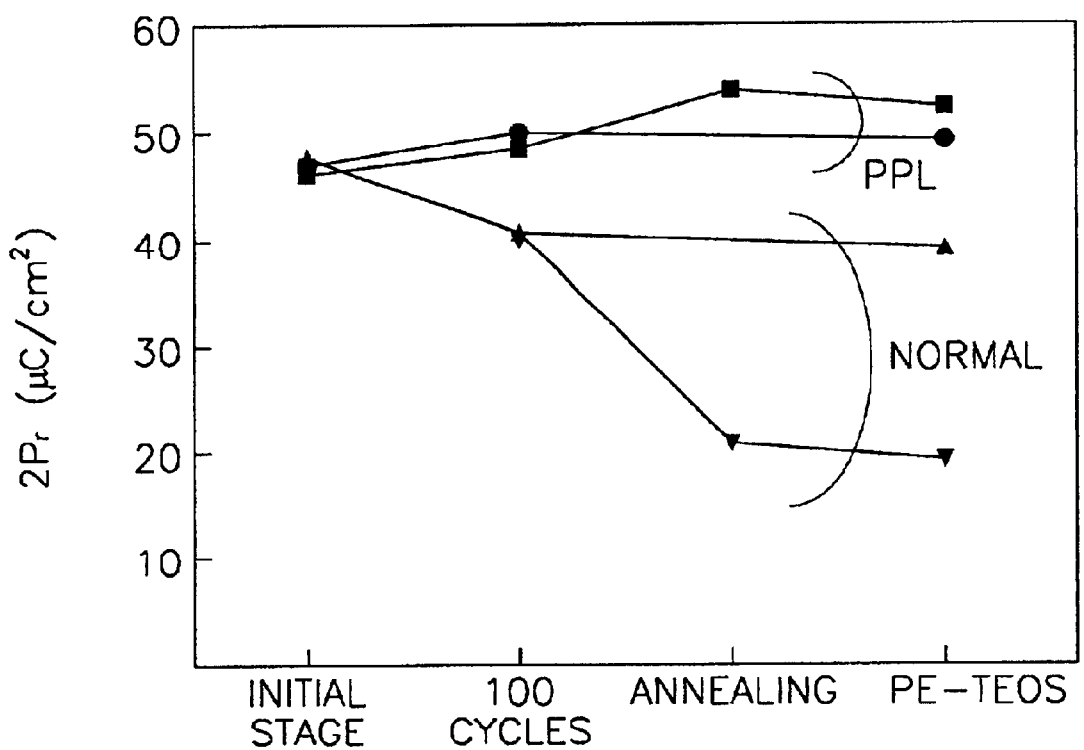
FIG. 4D is a graph illustrating effects of various encapsulating layer formation and other processes on remnant polarization.

In the graph of FIG. 4D, a portion represented by "NORMAL" indicates a case where an aluminum oxide (Al$_2$O$_3$) layer is formed on the surface of a capacitor to a thickness of 100 Å by an atomic layer deposition method at a substrate temperature of 300° C. and at a pressure of 0.5 Torr. A portion represented by "PLL" indicates a case where a thin aluminum oxide layer is formed on the surface of a capacitor to a thickness of about 10 Å and annealed, and a thick aluminum oxide layer is formed on the thin aluminum oxide layer to a thickness of about 100 Å. The vertical axis denotes remnant polarization. While the horizontal axis denotes manufacturing steps. An "initial stage" denotes a state in which a capacitor composed of a lower electrode, a dielectric layer and an upper electrode is completed. "Annealing" denotes a state in which an aluminum oxide layer is annealed using rapid thermal equipment at about 550° C. in an oxygen atmosphere. Finally, "PE-TEOS" denotes a step of supplying hydrogen and is illustrated for explaining the effect of an encapsulating layer blocking hydrogen according to embodiments of the present invention.

In the "initial stage" in which the thick aluminum oxide layer of 100 Å starts to be deposited, either after the thin aluminum oxide layer of 10 Å is formed or without forming the thin aluminum oxide layer, the difference between the remnant polarization values of "PLL" and "NORMAL" is not large. However, as a deposition process progresses, the remnant polarization value of a capacitor dielectric layer does not decrease in the case of "PLL", but decreases in the case of "NORMAL". Thereafter, when the thick aluminum oxide layers of 100 Å are annealed, the remnant polarization value of a capacitor dielectric layer increases in the case of "PLL" (represented by rectangular symbols), but decreases in the case of "NORMAL" (represented by triangular symbols). In other words, when an encapsulating layer composed of an aluminum oxide layer of 10 Å and subsequently formed aluminum oxide layer of 100 Å is used, the dielectric layer may not be significantly degraded. When an encapsulating layer is composed of only an aluminum oxide layer of 100 Å, the dielectric layer of a capacitor may be significantly degraded.

When the annealing process is not performed, the remnant polarization value during the formation of an aluminum oxide layer of 100 Å does not change very much in the cases of "PLL" and "NORMAL". It can be inferred from the above facts that annealing in "PLL" serves to reduce the degradation of a dielectric layer, but annealing in "NORMAL" accelerates the degradation of a dielectric layer.

Thereafter, PE-TEOS layers are formed on the surface of the encapsulating layers. In the case of "PLL", the remnant polarization value does not decrease compared to an initial remnant polarization value. In the case of "NORMAL", the remnant polarization value greatly decreases compared to an initial remnant polarization value. In other words, it can be seen that an encapsulating layer formed of a double aluminum oxide layer can provide excellent blocking hydrogen. PE-TEOS can be used for an interlayer insulation layer. Therefore, it can be seen from the graph of FIG. 4D that a double aluminum oxide layer according to the present invention can block the diffusion of hydrogen generated during the formation of an interlayer insulation layer after an encapsulating layer is formed.

In the present invention, degradation of a capacitor dielectric layer can be reduced using an encapsulating layer including a protection layer for protecting a capacitor from the diffusion of hydrogen generated during succeeding processes and a blocking layer for blocking the diffusion of hydrogen generated during the formation of the protection layer. The blocking layer is interposed between the protection layer and the capacitor. The protection layer and the blocking layer can be formed of the same material.

A blocking layer preferably is thinly formed, and a protection layer and the blocking layer preferably are formed of the same material. The blocking layer can block the diffusion of hydrogen generated during the formation of the protection layer and can be formed through a simple process. In addition, it is not necessary to perform separate photolithography for isolating a cell area from a peripheral area after the formation of the blocking layer. A process of forming a metal contact also can be simple. Because the present invention uses a thin blocking layer, an annealing process for the blocking layer is performed within a short time at 400–600° C. Accordingly, an increase in the plug resistance of a buried contact under a capacitor can be suppressed while a memory device is being manufactured.

In the drawings and specification, there have been disclosed typical preferred embodiments of the invention and, although specific terms are employed, they are used in a generic and descriptive sense only and not for purposes of limitation, the scope of the invention being set forth in the following claims. Although the invention has been described with reference to a particular embodiment, it will be apparent to one of ordinary skill in the art that modifications of the described embodiment may be made without departing from the spirit and scope of the invention.

That which is claimed is:

1. A method of forming a protective structure for a ferroelectric dielectric region on an integrated circuit substrate, the method comprising:

depositing a first metal oxide layer of a different material than the ferroelectric dielectric region directly on a surface of the ferroelectric dielectric region;

annealing the first metal oxide layer and the ferroelectric dielectric region; and depositing a non-conductive second metal oxide layer on the first metal oxide layer, wherein the first and second metal oxide layers are non-ferroelectric material layers.

2. A method according to claim 1, wherein the first metal oxide layer is sufficiently thin enough to enable a remnant polarization of the ferroelectric dielectric region to increase during the annealing of the first metal oxide layer and the ferroelectric dielectric region.

3. A method according to claim 1, wherein annealing the first metal oxide layer and the ferroelectric dielectric region comprises annealing the first metal oxide layer and the ferroelectric dielectric region in a manner sufficient to increase the remnant polarization of the ferroelectric dielectric region.

4. A method according to claim 1, wherein the first metal oxide layer is sufficiently thick enough to reduce diffusion of hydrogen into the dielectric region during the depositing of the second metal oxide layer.

5. A method according to claim 1:
wherein depositing a first metal oxide layer comprises depositing the first metal oxide layer according to one of an atomic layer deposition method, a low pressure chemical vapor deposition method, a high pressure chemical vapor deposition method, a plasma chemical vapor deposition method or a chemical vapor deposition method; and
wherein depositing a second metal oxide layer comprises depositing the second metal oxide layer according to one of an atomic layer deposition method, a low pressure chemical vapor deposition method, a high pressure chemical vapor deposition method, a plasma chemical vapor deposition method or a chemical vapor deposition method.

6. A method according to claim 1, wherein the ferroelectric dielectric region is a capacitor dielectric.

7. A method according to claim 1, wherein the ferroelectric dielectric region comprises a ferroelectric material selected from the group consisting of $SrTiO_3$, $BaTiO_3$, $(Ba, Sr)TiO_3$, $Pb(Zr, Ti)O_3$, $SrBi_2Ta_2O_9$, $(Pb, La)(Zr, Ti)O_3$ and $Bi_4Ti_3O_{12}$.

8. A method according to claim 1:
wherein the first metal oxide layer comprises a metal oxide selected from the group consisting of $Al_2O_3$, $TiO_2$, $ZrO_2$, $Ta_2O_5$ and $CeO_2$; and
wherein the second metal oxide layer comprises a metal oxide selected from the group consisting of $Al_2O_3$, $TiO_2$, $ZrO_2$, $Ta_2O_5$ and $CeO_2$.

9. A method according to claim 8, wherein the ferroelectric dielectric region comprises a ferroelectric material selected from the group consisting of $SrTiO_3$, $BaTiO_3$, $(Ba, Sr)TiO_3$, $Pb(Zr, Ti)O_3$, $SrBi_2Ta_2O_9$, $(Pb, La)(Zr, Ti)O_3$ and $Bi_4Ti_3O_{12}$.

10. A method according to claim 1, wherein the second metal oxide layer is thicker than the first metal oxide layer.

11. A method of forming a protective structure for a ferroelectric dielectric region on an integrated circuit substrate, the method comprising:

depositing a first metal oxide layer directly on a surface of the ferroelectric dielectric region;
annealing the first metal oxide layer and the ferroelectric dielectric region; and
depositing a second metal oxide layer on the first metal oxide layer,
wherein the first metal oxide layer comprises a metal oxide selected from the group consisting of $Al_2O_3$, $TiO_2$, $ZrO_2$, $Ta_2O_5$ and $CeO_2$; and
wherein the second metal oxide layer comprises a metal oxide selected from the group consisting of $Al_2O_3$, $TiO_2$, $ZrO_2$, $Ta_2O_5$ and $CeO_2$.

12. A method according to claim 11, wherein the second metal oxide layer is thicker than the first metal oxide layer.

13. A method according to claim 12, wherein the second metal oxide layer is at least about twice as thick as the first metal oxide layer.

14. A method according to claim 13, wherein the second metal oxide layer is less than about ten times as thick as the first metal oxide layer.

15. A method according to claim 12:
wherein depositing a first metal oxide layer comprises depositing a first $Al_2O_3$ layer; and
wherein depositing a second metal oxide layer comprises depositing a second $Al_2O_3$ layer.

16. A method according to claim 15, wherein the first $Al_2O_3$ layer has thickness in a range from about 10 Å to about 15 Å, and wherein the second $Al_2O_3$ layer has a thickness greater than about 50 Å.

17. A method according to claim 16:
wherein depositing a first $Al_2O_3$ layer comprises depositing the first $Al_2O_3$ layer at a temperature of about 500° C. in an oxygen atmosphere;
wherein annealing the first metal oxide layer and the ferroelectric dielectric region comprises annealing the first $Al_2O_3$ layer at a temperature in a range from about 400° C. to about 600° C.; and
wherein depositing a second $Al_2O_3$ layer comprises depositing the second $Al_2O_3$ layer at a temperature of about 500° C. in an oxygen atmosphere.

18. A method according to claim 17, further comprising annealing the second $Al_2O_3$ layer.

19. A method according to claim 11, wherein the ferroelectric dielectric region comprises a ferroelectric material selected from the group consisting of $SrTiO_3$, $BaTiO_3$, $(Ba, Sr)TiO_3$, $Pb(Zr, Ti)O_3$, $SrBi_2Ta_2O_9$, $(Pb, La)(Zr, Ti)O_3$ and $Bi_4Ti_3O_{12}$.

* * * * *